(12) United States Patent
Shigemura

(10) Patent No.: US 10,833,132 B2
(45) Date of Patent: Nov. 10, 2020

(54) HARD COAT-ATTACHED FILM TYPE TOUCH SENSOR AND FLEXIBLE DEVICE USING SAME

(71) Applicant: NISSHA CO., LTD., Kyoto (JP)

(72) Inventor: Kiyohito Shigemura, Kyoto (JP)

(73) Assignee: NISSHA CO., LTD., Kyoto (JP)

(*) Notice: Subject to any disclaimer, the term of this patent is extended or adjusted under 35 U.S.C. 154(b) by 0 days.

(21) Appl. No.: 16/621,288

(22) PCT Filed: Oct. 23, 2018

(86) PCT No.: PCT/JP2018/039269
§ 371 (c)(1),
(2) Date: Dec. 11, 2019

(87) PCT Pub. No.: WO2019/107014
PCT Pub. Date: Jun. 6, 2019

(65) Prior Publication Data
US 2020/0111845 A1 Apr. 9, 2020

(30) Foreign Application Priority Data

Nov. 28, 2017 (JP) ................................ 2017-228027

(51) Int. Cl.
*H01L 27/32* (2006.01)
*H01L 51/52* (2006.01)

(52) U.S. Cl.
CPC ........ *H01L 27/323* (2013.01); *H01L 51/5253* (2013.01); *H01L 2251/5338* (2013.01)

(58) Field of Classification Search
None
See application file for complete search history.

(56) References Cited

U.S. PATENT DOCUMENTS

| 7,697,304 B2* | 4/2010 | Naito | H05K 9/0096 |
| | | | 361/749 |
| 8,772,645 B2* | 7/2014 | Hwang | H01H 1/5805 |
| | | | 174/261 |

(Continued)

FOREIGN PATENT DOCUMENTS

| JP | H10-083575 A | 3/1998 | |
| JP | 2005018492 A * | 1/2005 | ............. G06F 3/033 |

(Continued)

OTHER PUBLICATIONS

JP2005-18492_translation. 2005. EPO. (Year: 2005).*

(Continued)

*Primary Examiner* — Jenny L Wagner
*Assistant Examiner* — Muhammed Azam
(74) *Attorney, Agent, or Firm* — Rankin, Hill & Clark LLP

(57) ABSTRACT

Provided is a hard coat-attached film type touch sensor excellent in workability in a manufacturing process while maintaining scratch resistance. A hard coat-attached film type touch sensor 1 used laminated on a display surface of a flexible display includes: a film type touch sensor 2; a first hard coat layer 4 provided in a large area on a region except for at least an edge portion 31 of one main surface of the film type touch sensor 2; and a second hard coat layer 5 provided adjacent to the first hard coat layer 4 in a region where the first hard coat layer 4 is not formed and having a lower hardness than the first hard coat layer 4.

20 Claims, 5 Drawing Sheets

(56) References Cited

U.S. PATENT DOCUMENTS

| | | | | |
|---|---|---|---|---|
| 9,452,591 B2* | 9/2016 | Chung | H04M 1/185 |
| 9,572,268 B2* | 2/2017 | Yamazaki | H01L 51/5262 |
| 9,614,022 B2* | 4/2017 | Miyake | H01L 27/3293 |
| 9,768,201 B2* | 9/2017 | Nakamura | H01L 27/124 |
| 10,082,694 B2* | 9/2018 | Choi | G02F 1/13336 |
| 10,182,474 B2* | 1/2019 | Kim | H05B 33/04 |
| 10,229,632 B2* | 3/2019 | Chung | G06F 3/147 |
| 10,268,238 B2* | 4/2019 | Hamburgen | H01L 27/323 |
| 10,461,274 B2* | 10/2019 | Kim | H01L 51/5237 |
| 10,534,400 B2* | 1/2020 | Wu | H04M 1/0214 |
| 10,541,380 B1* | 1/2020 | Sung | H01L 27/3258 |
| 10,616,972 B2* | 4/2020 | Ka | G06F 1/1652 |
| 2004/0091643 A1* | 5/2004 | Nair | G02B 1/111 428/1.33 |
| 2005/0142362 A1* | 6/2005 | Inaoka | C08J 7/0427 428/411.1 |
| 2005/0280893 A1* | 12/2005 | Baba | G03B 21/625 359/457 |
| 2005/0282945 A1* | 12/2005 | Faris | C09D 7/20 524/430 |
| 2005/0285811 A1* | 12/2005 | Kawase | G02F 1/13336 345/1.1 |
| 2007/0238804 A1* | 10/2007 | Ho | A61K 6/20 522/77 |
| 2008/0013265 A1* | 1/2008 | Kim | G06F 1/1681 361/679.04 |
| 2010/0243295 A1* | 9/2010 | Allemand | H05K 9/0092 174/250 |
| 2011/0135905 A1* | 6/2011 | Wakita | C08G 18/792 428/221 |
| 2011/0209749 A1* | 9/2011 | Yang | G06F 3/041 136/255 |
| 2012/0075166 A1* | 3/2012 | Marti | G02B 27/0093 345/1.1 |
| 2013/0002133 A1* | 1/2013 | Jin | G06F 1/169 313/511 |
| 2013/0002572 A1* | 1/2013 | Jin | G06F 1/1637 345/173 |
| 2013/0002583 A1* | 1/2013 | Jin | G06F 3/041 345/173 |
| 2014/0002385 A1* | 1/2014 | Ka | H01L 51/5253 345/173 |
| 2014/0065430 A1* | 3/2014 | Yamazaki | G02F 1/133308 428/426 |
| 2014/0183478 A1* | 7/2014 | Lee | H01L 27/323 257/40 |
| 2014/0217373 A1* | 8/2014 | Youn | H05K 1/0281 257/40 |
| 2014/0291649 A1* | 10/2014 | Takahashi | H01L 51/5228 257/40 |
| 2014/0306941 A1* | 10/2014 | Kim | H04M 1/0268 345/204 |
| 2014/0353639 A1* | 12/2014 | Sakamoto | H01L 51/56 257/40 |
| 2015/0016126 A1* | 1/2015 | Hirakata | F21V 15/012 362/418 |
| 2015/0022090 A1* | 1/2015 | Kim | G06F 1/3265 315/130 |
| 2015/0023030 A1* | 1/2015 | Tsukamoto | G06F 1/1618 362/419 |
| 2015/0023031 A1* | 1/2015 | Endo | F21V 15/04 362/427 |
| 2015/0062525 A1* | 3/2015 | Hirakata | G02F 1/133305 349/158 |
| 2015/0062927 A1* | 3/2015 | Hirakata | G09F 9/301 362/362 |
| 2015/0177789 A1* | 6/2015 | Jinbo | H01L 27/323 313/511 |
| 2015/0179717 A1* | 6/2015 | Kawata | H01L 29/7869 257/43 |
| 2016/0007441 A1 | 1/2016 | Matsueda | |
| 2016/0044751 A1* | 2/2016 | Ikeda | H01L 27/3293 362/227 |
| 2016/0085268 A1* | 3/2016 | Aurongzeb | G06F 1/1677 345/156 |
| 2016/0093685 A1* | 3/2016 | Kwon | H01L 51/5237 257/40 |
| 2016/0154268 A1* | 6/2016 | Yamazaki | G02F 1/13452 349/138 |
| 2016/0155967 A1* | 6/2016 | Lee | H01L 27/323 257/88 |
| 2016/0181346 A1* | 6/2016 | Kwon | H01L 27/3276 257/40 |
| 2016/0363304 A1* | 12/2016 | Omata | G06F 1/00 |
| 2016/0372690 A1* | 12/2016 | Hack | H01L 27/3276 |
| 2016/0380033 A1* | 12/2016 | Lee | G06F 1/1652 257/40 |
| 2017/0040562 A1* | 2/2017 | Kim | H01L 27/3276 |
| 2017/0060189 A1* | 3/2017 | Sohn | G06F 1/1652 |
| 2017/0063374 A1* | 3/2017 | Yamamoto | G06F 3/0412 |
| 2017/0200915 A1* | 7/2017 | Lee | H01L 27/323 |
| 2017/0255309 A1* | 9/2017 | Park | H01L 27/3276 |
| 2017/0263889 A1* | 9/2017 | Seki | H01L 51/0097 |
| 2017/0276840 A1* | 9/2017 | Horio | B32B 27/281 |
| 2017/0334180 A1* | 11/2017 | Okamoto | B32B 27/281 |
| 2018/0018907 A1* | 1/2018 | Kim | G09F 9/301 |
| 2018/0088631 A1* | 3/2018 | Park | G06F 1/1643 |
| 2018/0138440 A1* | 5/2018 | Chung | H01L 27/323 |
| 2018/0166652 A1* | 6/2018 | Kim | B32B 15/20 |
| 2018/0248150 A1* | 8/2018 | Oh | H01L 27/323 |
| 2018/0286926 A1* | 10/2018 | Kim | H01L 51/003 |
| 2018/0287092 A1* | 10/2018 | Song | H01L 51/5253 |
| 2019/0131364 A1* | 5/2019 | Hayk | H01L 27/3246 |
| 2019/0139463 A1* | 5/2019 | Kim | G09F 9/301 |
| 2019/0165310 A1* | 5/2019 | Kinjo | H01L 27/3276 |
| 2019/0196619 A1* | 6/2019 | Baek | G06F 3/04166 |
| 2019/0273212 A1* | 9/2019 | Shin | H01L 51/5253 |
| 2019/0305236 A1* | 10/2019 | Choi | H01L 27/1218 |
| 2019/0319215 A1* | 10/2019 | Lee | H01L 51/0097 |
| 2019/0326375 A1* | 10/2019 | Ochi | H01L 51/5253 |
| 2019/0346591 A1* | 11/2019 | Thothadri | G02F 1/133308 |
| 2020/0042116 A1* | 2/2020 | Li | H01L 51/5253 |
| 2020/0105169 A1* | 4/2020 | Jeong | H01L 51/5281 |
| 2020/0111845 A1* | 4/2020 | Shigemura | G06F 3/041 |
| 2020/0111856 A1* | 4/2020 | Lee | H01L 51/5284 |
| 2020/0111994 A1* | 4/2020 | Kim | B32B 3/28 |

FOREIGN PATENT DOCUMENTS

| | | |
|---|---|---|
| JP | 2008-032928 A | 2/2008 |
| JP | 2016-015618 A | 1/2016 |

OTHER PUBLICATIONS

International Search Report dated Jan. 8, 2019 filed in PCT/JP2018/039269, 2 pages.

Decision to grant of JP 2017-228027 dated Jul. 9, 2019, 4 pages.

* cited by examiner

HARD COAT-ATTACHED FILM TYPE TOUCH SENSOR AND FLEXIBLE DEVICE USING SAME

TECHNICAL FIELD

The present invention relates to a hard coat-attached film type touch sensor that is used laminated on a display surface of a flexible display.

BACKGROUND ART

An organic EL (organic light-emitting diode: OLED) display does not require a backlight. Therefore, an organic EL display is power saving, thin and light compared with a liquid crystal display. In addition, the organic EL display has a higher contrast in image brightness and higher response speed than the liquid crystal display. Therefore, in recent years, the number of set manufacturers that employ organic EL displays in smartphones is increasing.

Further, when the organic EL display is a flexible type, the organic EL display can be rolled or folded to be carried. As a result, it is expected that appearance of mobile devices such as smartphones will change significantly (see PATENT LITERATURE 1).

By the way, a touch sensor as a direct input interface is indispensable for display screens of smartphones, tablet terminals, rear liquid crystals of digital cameras, game machines or the like.

The touch sensor includes a glass type based on glass and a film type based on film. When the touch sensor is used laminated on the display surface of the flexible organic EL display, the film type touch sensor is preferable in order to take advantage of flexibility of the organic EL display.

However, when the film type touch sensor is used laminated on the display surface of the flexible organic EL display, a uniform hard coat layer is required on the outermost surface in order to suppress reduction in visibility of the organic EL display due to scratches on a surface of the touch sensor.

CITATION LIST

Patent Literature

PATENT LITERATURE 1: JP-A-2016-015618

SUMMARY OF THE INVENTION

Problems to be Solved by the Invention

However, as scratch resistance of the material used for the hard coat layer provided entirely on the outermost surface of the film type touch sensor is higher, workability in a manufacturing process tends to be deteriorated.

Deterioration of workability means that, in outline processing such as punching, quality or yield is reduced due to defects such as cracks due to pressure that are generated at a processing site, that is, at an edge portion of a processed product, and that a processing method such as laser processing having problems in terms of production efficiency, thermal damage or the like must be taken in order to avoid the defects such as cracks due to pressure.

The defects such as cracks are generated because stress is partially concentrated on the hard coat layer having high hardness formed on the film type touch sensor, since the flexible film type touch sensor that supports the hard coat layer is easily deformed by pressure.

Note that when the defects such as cracks generated during outline processing are very small, there is no discomfort in appearance. However, when used in flexible applications, and the product is bent many times, breaks or visible cracks spread throughout the hard coat. The breaks or cracks start from an end surface that has been broken by the stress concentrated on a part of fine irregularities on the end surface such as microcracks.

An object of the present invention is to provide a hard coat-attached film type touch sensor excellent in workability in the manufacturing process while maintaining scratch resistance, and a flexible device using the same.

Solution to the Problems

Hereinafter, a plurality of modes as means for solving the problems will be described. These modes can be arbitrarily combined as necessary.

The hard coat-attached film type touch sensor according to an aspect of the present invention is laminated on the display surface of the flexible display when used to obtain the flexible device. The hard coat-attached film type touch sensor includes a film type touch sensor, a first hard coat layer, and a second hard coat layer.

The first hard coat layer of large area is provided on one main surface of the film type touch sensor except for at least an edge portion thereof.

The second hard coat layer is provided to be adjacent to the first hard coat layer on a region where the first hard coat layer is not formed. The second hard coat layer has a lower hardness than the first hard coat layer.

In the hard coat-attached film type touch sensor, the second hard coat layer having a lower hardness than the first hard coat layer easily follows deformation of the touch sensor due to pressure. As a result, the stress is less likely to partially concentrate. Therefore, the defects such as cracks can be prevented.

The film type touch sensor may have a transparent window portion and a window frame portion surrounding the transparent window portion. In this case, a region provided with the first hard coat layer is present on the transparent window portion and window frame portion except the edge portion.

In the film type touch sensor having the transparent window portion and the window frame portion surrounding the transparent window portion, the region provided with the first hard coat layer may be present on the transparent window portion. And a region provided with the second hard coat layer may be present on the window frame surrounding the transparent window portion.

The hard coat-attached film type touch sensor may have a strip-shaped bending portion for folding at a specific position. In this case, the first hard coat layer is not provided in the strip-shaped bending portion, but the second hard coat layer is provided.

The hard coat-attached film type touch sensor may have a through-hole portion. In this case, periphery of the through-hole portion is included in the aforementioned edge portion.

The hardness of the region provided with the first hard coat layer may be in a range of pencil hardness H to 9H according to a pencil hardness test specified in JIS K 5600-5-4:1999. The hardness of the region provided with the second hard coat layer having a lower hardness than the first hard coat layer may be in the range of pencil hardness 6B to 4H.

A difference between the hardness of the region provided with the first hard coat layer and the hardness of the region provided with the second hard coat layer may be at least two classes.

The first hard coat layer and the second hard coat layer may be a continuous integral film made of the same active ray curable resin. In this case, only difference between the two coat layers is degree of curing by light irradiation. The first hard coat layer and the second hard coat layer may be separate films made of materials having different hardnesses.

The first hard coat layer and the second hard coat layer may be flush with each other and in a uniform matte state.

An area of an independent region provided with the first hard coat layer may be 10 to 99.98% of a whole of the film type touch sensor.

The edge portion may be present within 1.5 mm from a side surface of the film type touch sensor.

The region provided with the second hard coat layer may be further divided into a plurality of regions having different hardnesses.

EFFECTS OF THE INVENTION

The hard coat-attached film type touch sensor according to the present invention and the flexible device using the same are excellent in workability in the manufacturing process while maintaining scratch resistance.

DESCRIPTION OF THE EMBODIMENTS

Hereinafter, the present embodiment will be described with reference to the drawings.

Figure 1:
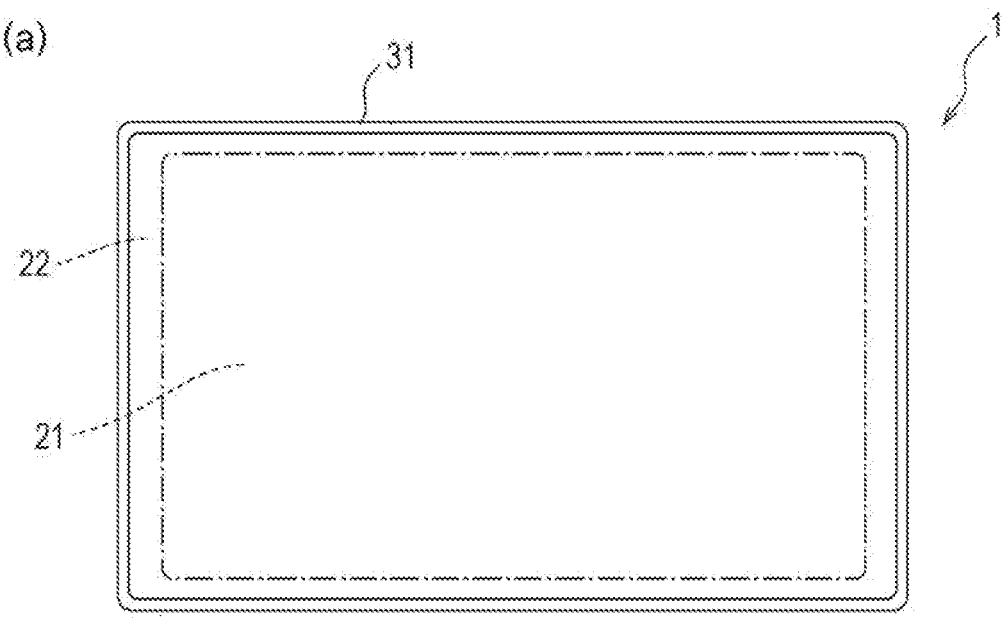
FIGS. 1A and 1B are schematic views of a hard coat-attached film type touch sensor according to a first embodiment of the present invention.
Figure 1:
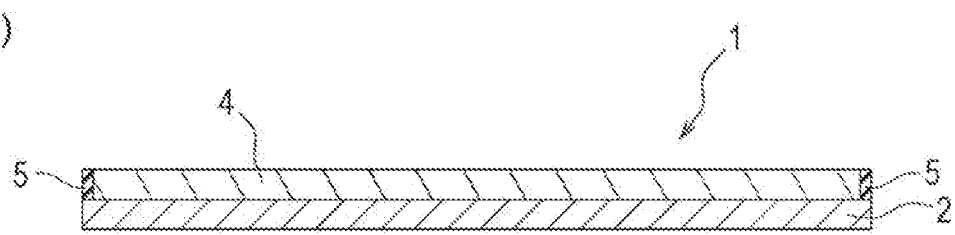

1. First Embodiment (1) Basic Structure of Hard Coat-Attached Film Type Touch Sensor A hard coat-attached film type touch sensor 1 according to a first embodiment will be described with reference to FIGS. 1A and 1B. FIGS. 1A and 1B are schematic views of the hard coat-attached film type touch sensor according to the first embodiment of the present invention. FIG. 1A is a plan view of the hard coat-attached film type touch sensor 1. FIG. 1B is a cross-sectional view at center of short side of the hard coat-attached film type touch sensor 1.

The hard coat-attached film type touch sensor 1 is used laminated on a display surface of a flexible organic EL display. The hard coat-attached film type touch sensor 1 is a device that recognizes a position by a sensor sensing a change in capacitance (charge) occurring when a surface is touched with a finger.

The hard coat-attached film type touch sensor 1 includes a film type touch sensor 2, a first hard coat layer 4, and a second hard coat layer 5.

The film type touch sensor 2 is a member including an electrode film having a patterned transparent electrode formed on a transparent film base material. Therefore, it is possible to realize not only a flat surface but also a design including a curved surface shape that takes advantage of characteristics of the film base material. As shown in FIG. 1A, the film type touch sensor 2 has a transparent window portion 21 and a window frame portion 22 surrounding the transparent window portion 21. Usually, the transparent window portion 21 has X and Y transparent electrodes. In this way, display on the organic EL display can be seen through. And the window frame portion 22 has routing wiring. Usually, detection method is a capacitance method.

The first hard coat layer 4 is a member for protecting a surface of the film type touch sensor 2 from scratches. As shown in FIG. 1B, the first hard coat layer 4 is provided on one main surface of the film type touch sensor 2 so as to have a large area except for an edge portion 31. More specifically, a region provided with the first hard coat layer 4 is present on the transparent window portion 21 and the window frame portion 22 of the film type touch sensor 2 except for the edge portion 31.

The second hard coat layer 5 is a member for protecting the surface of the film type touch sensor 2 from scratches like the first hard coat layer 4. As shown in FIG. 1B, the second hard coat layer 5 is provided adjacent to the first hard coat layer 4 in a region where the first hard coat layer 4 is not formed, that is, in the edge portion 31.

(2) Effect of Combination of First Hard Coat Layer 4 and Second Hard Coat Layer 5

The second hard coat layer 5 of the present invention is characterized by having a lower hardness than the first hard coat layer 4. This makes it possible to achieve both surface scratch resistance and workability.

As shown in FIGS. 1A and 1B, the first hard coat layer 4 having high hardness is provided on the transparent window portion 21 and the window frame portion 22 of the film type touch sensor 2 except for the edge portion 31. This makes it possible to suppress reduction in visibility of the flexible organic EL display due to scratch on the outermost surface (surface scratch resistance).

On the other hand, the second hard coat layer 5 having low hardness is provided adjacent to the first hard coat layer 4 in the region where the first hard coat layer 4 is not formed, that is, in the edge portion 31. This prevents the defects such as cracks from occurring at the edge portion 31 during processing such as punching. As a result, yield, quality, and production efficiency can be improved. (workability).

The defects such as cracks do not occur, because the second hard coat layer 5 having a lower hardness than the first hard coat layer 4 easily follows deformation of the film type touch sensor 2 due to pressure, and as a result, stress is less likely to partially concentrate.

Surface hardnesses of the first hard coat layer 4 and the second hard coat layer 5 can be determined by a known measuring method. The surface hardness according to the present invention is a pencil hardness measured by a pencil hardness test specified in JIS K 5600-5-4:1999. The pencil hardness test is performed under test conditions of load of 750 g and 45° scratch.

If the second hard coat layer 5 has a lower hardness than the first hard coat layer 4, the above effect can be obtained. The hardness of the region provided with the first hard coat layer 4 is preferably in a range of pencil hardness H to 9H. And the hardness of the region provided with the second hard coat layer 5 having a lower hardness than the first hard coat layer 4 is preferably in the range of pencil hardness 6B to 4H. The required surface scratch resistance and workability differ depending on constituent materials or application of the film type touch sensor 2. Therefore, hardness level is relative. The hardness of the region provided with the first hard coat layer 4 is more preferably in the range of pencil hardness of 3H to 9H.

Further, when a hardness difference between the two regions is at least two classes, an effect of achieving both surface scratch resistance and workability is more prominent.

Note that the above hardness range and hardness class difference are shown as particularly preferable examples. In the present invention, it is sufficient that the second hard coat layer 5 has at least a lower hardness than the first hard coat layer 4, (3) Materials for First Hard Coat Layer 4 and Second Hard Coat Layer 5

The first hard coat laser and the second hard coat layer are a continuous integral film made of the same active ray curable resin. Only difference is degree of curing by light irradiation.

Known materials can be used as the active ray curable resin.

Typical examples include ultraviolet curable resins and electron beam curable resins. However, a resin that is cured by irradiation with active rays other than ultraviolet rays and electron beams may be used.

Examples of the ultraviolet curable resins include ultraviolet curable acrylic urethane-based resins, ultraviolet curable polyester acrylate-based resins, ultraviolet curable epoxy acrylate-based resins, ultraviolet curable polyol acrylate-based resins, ultraviolet curable epoxy resins and the like.

In general, the ultraviolet curable acrylic urethane-based resin can be easily obtained by reacting a product, which is obtained by reacting a polyester polyol with an isocyanate monomer or a prepolymer, with an acrylate-based monomer having a hydroxyl group, such as 2-hydroxyethyl acrylate, 2-hydroxyethyl methacrylate (hereinafter, the term acrylate includes methacrylate), or 2-hydroxypropyl acrylate.

In general, the ultraviolet curable polyester acrylate-based resin can be easily obtained by reacting a polyester polyol with 2-hydroxyethyl acrylate or a 2-hydroxy acrylate-based monomer.

A specific example of the ultraviolet curable epoxy acrylate-based resin includes a resin obtained by reacting an epoxy acrylate as an oligomer with reactive diluent and photoreaction initiator added thereto. As the photoreaction initiator, one, two or more photoreaction initiators selected from benzoin derivatives, oxime ketone derivatives, benzophenone derivatives, thioxanthone derivatives and the like can be used.

Specific examples of the ultraviolet curable polyol acrylate-based resins include trimethylolpropane triacrylate, ditrimethylolpropane tetraacrylate, pentaerythritol triacrylate, pentaerythritol tetraacrylate, dipentaerythritol hexaacrylate, alkyl-modified dipentaerythritol pentaacrylate, and the like.

These resins are usually used together with known photosensitizers. The photoreaction initiator can also be used as the photosensitizer. Specific examples of the photosensitizer include acetophenone, benzophenone, hydroxybenzophenone, Michler's ketone, α-amyloxime ester, thioxanthone, and derivatives thereof. When an epoxy acrylate-based photoreactive agent is used, the sensitizer such as n-butylamine, triethylamine, or tri-n-butylphosphine can be used. An addition amount of the photoreaction initiator or the photosensitizer contained in an ultraviolet curable resin composition excluding solvent components that volatilize after coating and drying is usually 1 to 10 mass % of the composition. The addition amount is preferably 2.5 to 6 mass %.

Examples of resin monomers include common monomers such as methyl acrylate, ethyl acrylate, butyl acrylate, vinyl acetate, benzyl acrylate, cyclohexyl acrylate, and styrene as monomers having one unsaturated double bond. Further, examples of monomers having two or more unsaturated double bonds include ethylene glycol diacrylate, propylene glycol diacrylate, divinylbenzene, 1,4-cyclohexane diacrylate, 1,4-cyclohexyldimethyl di acrylate, the above-mentioned trimethylolpropane triacrylate, pentaerythritol tetraacrylic ester, and the like.

For example, the ultraviolet curable resin can be appropriately selected and used from ADEKAOPTOMER KR.BY Series: KR-400, KR-410, KR-550, KR-566, KR-567, or BY-320B (the above are manufactured by Asahi Denka Co., Ltd.), KOETHARD A-101-KK, A-101-WS, C-302, C-401-N, C-501, M-101, M-102, T-102, D-102, NS-101, FT-102Q8, MAG-1-P20, AG-106, or M-101-C (the above are manufactured by Koei Chemical Co., Ltd.), SEIKA-BEAM PHC2210(S), PHCX-9(K-3), PHC2213, DP-10, DP-20, DP-30, P1000, P1100, P1200, P1300, P1400, P1500, P1600, or SCR900 (the above are manufactured by Dainichiseika Color & Chemicals Mfg. Co., Ltd.), KRM7033, KRM7039, KRM7130, KRM7131, UVECRYL29201, or UVECRYL29202 (the above are manufactured by Daicel U.C.B. Co., Ltd.), RC-5015, RC-5016, RC-5020, RC-5031, RC-5100, RC-5102, RC-5120, RC-5122, RC-5152, RC-5171, RC-5180, or RC-5181 (the above are manufactured by Dainippon Ink & Chemicals, Inc.), OLEX No. 340 CLEAR (manufactured by Chugoku Marine Paints, Ltd.), SANRAD H-601 (manufactured by Sanyo Chemical Industries, Ltd.), SP-1509, SP-1507 (manufactured by Showa Highpolymer Co., Ltd.), RCC-15C (manufactured by Grace Japan Co., Ltd.) ARONIX M-6100, M-8030, or M-8060 (the above are manufactured by Toagosei Co., Ltd.), or other commercially available ultraviolet curable resins.

(4) Method for Forming First Hard Coat Layer 4 and Second Hard Coat Layer 5

As described above, the first hard coat layer 4 and the second hard coat layer 5 are formed as the continuous integral film made of the same active ray curable resin. As a method of forming this film on the film type touch sensor 2, a known method of forming a thin film can be used. Examples of the method include a wet coating method, a lamination method using a hard coat-attached film, and a transfer method using a hard coat transfer film.

An example of the wet coating method is a method of forming a wet thin film using a coating solution prepared by dissolving the active ray curable resin in a solvent. Examples of the solvent include hydrocarbons, alcohols, ketones, esters, glycol ethers, and other solvents.

As such a wet coating method, a coating method (coating apparatus) using a known solution can be used. Examples of coating methods used in this method include spin coating, dip coating, extrusion coating, roll coat coating, spray coating, gravure coating, wire bar coating, air knife coating, slide hopper coating, curtain coating, and the like.

A hard coat film is formed on the film type touch sensor 2 by the above coating method. The formed hard coat film is irradiated with active rays in order to cure the film. As a light source for forming a cured film layer by a photocuring reaction of the active ray curable resin, any light source for generating ultraviolet rays can be used. Examples of the light source include low pressure mercury lamps, medium pressure mercury lamps, high pressure mercury lamps, ultra-high pressure mercury lamps, carbon arc lamps, metal halide lamps, xenon lamps, and the like. Out of irradiation conditions that differ depending on each lamp, an amount of irradiation light may be about 20 to 10,000 mJ/cm$^2$. The amount of irradiation light is preferably 50 to 2000 mJ/cm$^2$. The active rays in near-ultraviolet region to visible light region can be used by using the sensitizer having an absorption maximum in the region.

The ultraviolet curable resin composition is irradiated with ultraviolet rays from the light source after coating and drying. Irradiation time is preferably 0.5 seconds to 5 minutes. The irradiation time is more preferably 3 seconds to 2 minutes from curing efficiency and work efficiency of the ultraviolet curable resin. Further, in the case of the lamination method using the hard coat-attached film, or the transfer method using the hard coat transfer film, the resin composition can also be cured by irradiating the resin composition in a state of the hard coat-attached film or the transfer film with ultraviolet rays in advance. Or, the resin composition can also be cured after lamination or transfer.

As described above, the first hard coat layer 4 and the second hard coat layer 5 may be formed such that the both are the continuous integral film made of the same active ray curable resin, and the difference between them is only the hardness. In this case, the continuous integral film is coated on the film type touch sensor 2 by the wet coating method. The whole is then irradiated with a weak active ray. Thereafter, the entire film excluding the edge portion 31 is further irradiated with active rays.

Thus, the thin film becomes the first hard coat layer 4 having high hardness except for the edge portion 31. And only the edge portion 31 becomes the second hard coat layer 5 having low hardness. Of course, the first hard coat layer 4 and the second hard coat layer 5 are flush with each other.

A method for forming the first hard coat layer 4 and the second hard coat layer 5 by the wet coating method has been described above. The lamination method using the hard coat-attached film and the transfer method using the hard coat transfer film can be basically used in the same manner.

In the wet coating method, the thin film before light irradiation is directly coated and dried on the film type touch sensor 2. On the other hand, in the lamination method using the hard coat-attached film, the thin film before light irradiation is coated and dried in advance on a transparent resin film by the wet coating method. Then, the obtained hard coat-attached film is laminated on the film type touch sensor 2 so that the thin film side becomes the outermost surface. Thereafter, the light is irradiated by the same method as in the wet coating method.

Further, in the transfer method using the hard coat transfer, the thin film before light irradiation is coated and dried in advance on the resin film having mold releasability by the wet coating method. Then, the obtained hard coat transfer film is laminated on the film type touch sensor 2 so that the resin film side is the outermost surface. Thereafter, the resin film is peeled off. Thereafter, the light is irradiated by the same method as in the wet coating method.

In the first embodiment, the edge portion 31 that is a region where the second hard coat layer 5 is formed is present within 1.5 mm from an outer peripheral side surface of the film type touch sensor 2.

The first hard coat layer 4 and the second hard coat layer 5 are the continuous integral film made of the same active ray curable resin. However, their optical characteristics differ depending on degree of light irradiation. As a result, a visual discomfort at the boundary between the first hard coat layer 4 and the second hard coat layer 5 occurs.

However, the edge portion 31 which is the region where the second hard coat layer 5 is formed is present within 1.5 mm from the outer peripheral side surface of the film type touch sensor 2. Therefore, the second hard coat layer 5 is felt to emphasize an outer peripheral shape of the film type touch sensor 2 because it is close to the outer peripheral side surface. As a result, the visual discomfort is reduced. Further, the second hard coat layer 5 may not be visually recognized at all in a final product depending on a positional relationship with another part to be combined.

Note that the optical characteristics include transmittance, turbidity, color difference, refractive index, or the like. There are various characteristics recognized as differences depending on the active ray curable resin to be used.

(5) Each Component of Film Type Touch Sensor 2

The film type touch sensor 2 is a known technology. Therefore, description thereof can be omitted. However, the film type touch sensor 2 is related to problems to be solved by the present invention in terms of flexibility. Therefore, each component of the film type touch sensor 2 will be described briefly.

<Film Base Material>

Examples of the film base material include films of resins such as acrylic, polycarbonate, polyester, polybutylene terephthalate, polypropylene, polyamide, polyurethane, polyvinyl chloride, polyvinyl fluoride, polyimide, cyclic olefin polymer, cyclic olefin copolymer, and triacetyl cellulose. A plurality of film base materials may be used. A total thickness of the film base materials can be appropriately set within a range of 18 to 200 μm. When the total thickness is less than 18 μm, strength as the layer is insufficient. Therefore, the film may be broken, and thus its handling is difficult. When the total thickness exceeds 200 μm, the film base material is too rigid, so that flexibility cannot be obtained.

<Transparent Electrodes>

The transparent electrode can be formed by patterning each transparent conductive film.

As the transparent conductive film, for example, a flexible and transparent conductive material including various resin binders such as acrylic, polyester, polyurethane, or polyvinyl chloride, and conductive nanofibers can be used. Further, the transparent conductive film can be provided by various general printing methods such as gravure printing, offset printing, or screen printing. In addition, the transparent conductive film can also be provided, for example, by attaching a sheet (DFR) such as a dry film made of a photocurable resin containing conductive nanofibers.

As the conductive nanofibers, for example, silver, gold, copper, nickel, gold-plated silver, aluminum, or the like can be used. Specifically, examples of the conductive nanofibers include metal nanofibers, peptide nanofibers and the like. The metal nanofibers are produced by continuously drawing the fiber by applying voltage or current from a tip end portion of a probe to a surface of a precursor carrying ions of metal such as gold, silver, platinum, copper, or palladium. Peptide fibers can be obtained by adding gold panicles to the nanofibers formed by self-assembly of peptides or their derivatives. Further, dark conductive nanofibers 3 such as carbon nanotubes are also targeted when a difference from a shadow is recognized in color or reflectivity. Note that the conductive nanofibers are not limited to the above example. Particularly preferred conductive nanowires are silver nanofibers.

The thickness of the transparent conductive film can be appropriately set within the range of several tens of nm to several hundreds of nm. When the thickness is less than several tens of nm, the strength of the layer is insufficient. When the thickness is more than several hundreds of nm, the flexibility is not sufficient.

A mesh pattern made of fine metal wires as the transparent electrode may be formed, in this case, the organic EL display is seen through from an opening of the mesh. Silver, copper, aluminum or the like can be used as materials for the fine metal wires.

<Routing Wiring>

The routing wiring is provided on the window frame portion 22 of the film type touch sensor 2. One end thereof is connected to the transparent electrode. The other end thereof is an external output end. The external output end is a terminal portion for transmission to a detection control part via a flexible printed circuit board (FPC) which is not shown.

The routing wiring is provided in the window frame portion 22 of the film type touch sensor 2 as described above. Therefore, the routing wiring does not need to be formed of a material having translucency. Therefore, the routing wiring can be formed of a material having high conductivity. The routing wiring is made of, for example, a metal material such as aluminum, molybdenum, silver, chromium, copper, or an alloy thereof.

A method for forming the routing wiring is not particularly limited. The formation method is appropriately selected according to a required pattern width, pattern interval or the like. For example, when it is required to reduce a width of the routing wiring, the routing wiring is formed by patterning a metal layer provided on the film base material by a so-called photolithography method. This makes it possible to form each routing wiring at a narrow pitch. For example, the width of each routing wiring and the interval between the routing wirings can be 20 µm or less.

When it is required to reduce a resistance value of the routing wiring, the routing wiring is formed, for example, by applying a conductive paste such as silver paste using a screen printing method. This makes it possible to increase the thickness of the routing wiring, for example, to 1 µm or more. As a result, the resistance value of the routing wiring can be further reduced.

2. Second Embodiment

Figure 2:
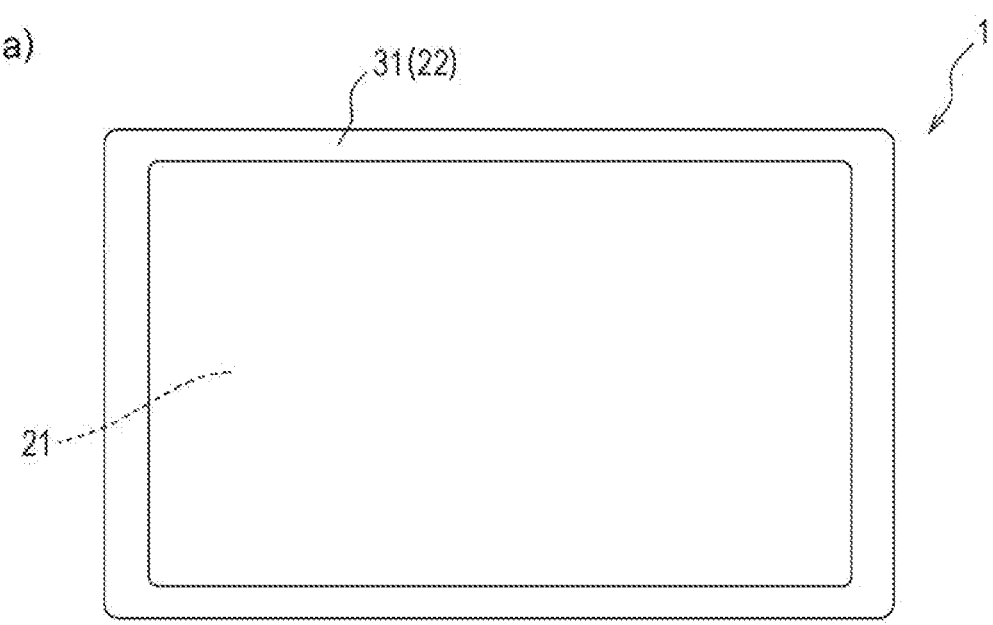
FIGS. 2A and 2B are schematic views of a hard coat-attached film type touch sensor according to a second embodiment of the present invention.
Figure 2:
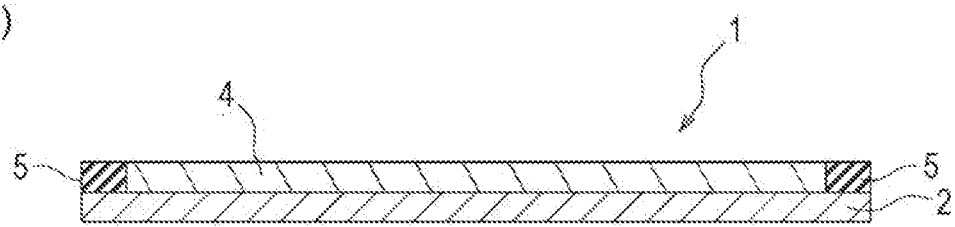

The hard coat-attached film type touch sensor 1 according to a second embodiment will be described with reference to FIGS. 2A and 2B. FIGS. 2A and 2B are schematic views of the hard coat-attached film type touch sensor according to the second embodiment of the present invention. FIG. 2A is a plan view of the hard coat-attached film type touch sensor 1. FIG. 2B is a cross-sectional view at the center of the short side of the hard coat-attached film type touch sensor 1.

As shown in FIGS. 2A and 2B, the second embodiment is different from the first embodiment in that the region provided with the first hard coat layer 4 is present only on the transparent window portion 21 of the film type touch sensor 2, and the region provided with the second hard coat layer 5 is present on the entire window frame portion 22.

That is, the boundary between the first hard coat layer 4 and the second hard coat layer 5 coincides with a boundary between the transparent window portion 21 and the window frame portion 22 of the film type touch sensor 2. In this case, the visual discomfort at the boundary between the first hard coat layer 4 and the second hard coat layer 5 can be eliminated.

The second embodiment is the same as the first embodiment on other points. Therefore, description about overlapping portions will be omitted.

3. Third Embodiment

Figure 3:
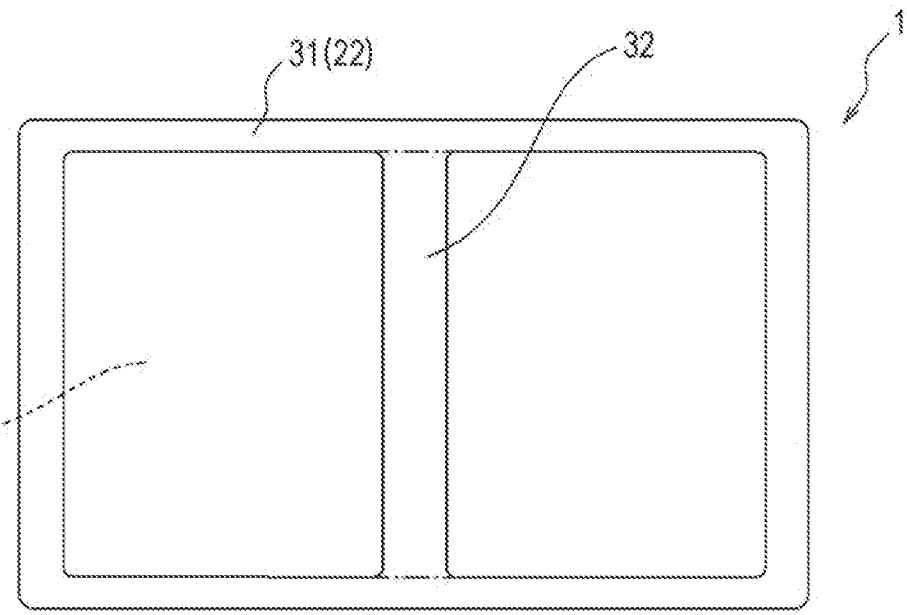
FIGS. 3A and 3B are schematic views of a hard coat-attached film type touch sensor according to a third embodiment of the present invention.
Figure 3:
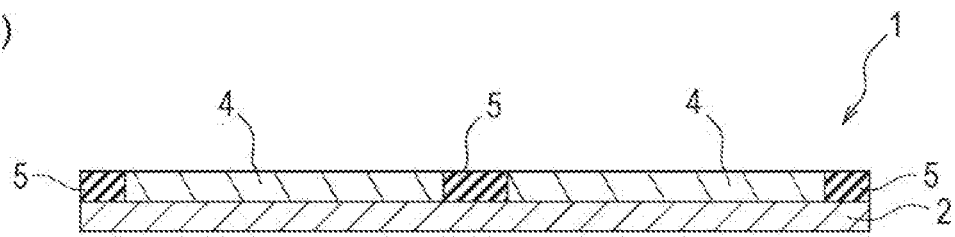

The hard coat-attached film type touch sensor 1 according to a third embodiment will be described with reference to FIGS. 3A and 3B. FIGS. 3A and 3B are schematic views of the hard coat-attached film type touch sensor according to the third embodiment of the present invention. FIG. 3A is a plan view of the hard coat-attached film type touch sensor 1. FIG. 39 is a cross-sectional view at the center of the short side of the hard coat-attached film type touch sensor 1.

As shown in FIGS. 3A and 3B, the hard coat-attached film type touch sensor 1 has one strip-shaped bending portion 32 for folding parallel to the short side at a center in a long side direction thereof. Instead of providing the first hard coat layer 4, the second hard coat layer 5 is provided on the strip-shaped bending portion 32. In the above points, the third embodiment is different from the second embodiment.

In case, the second hard coat layer 5 having a lower hardness than the first hard coat layer 4 is also provided in the strip-shaped bending portion 32. Therefore, even if the hard coat-attached film type touch sensor 1 used is repeatedly folded, the strip-shaped bending portion 32 does not crack.

Note that the surface scratch resistance is reduced in the strip-shaped bending portion 32. However, in a usage form folded in two, frequency of fine display by the flexible organic EL display is low in the strip-shaped bending portion 32. Therefore, effects on visibility are small.

As described above, the total thickness of the film base material of the film type touch sensor 2 is 18 to 200 µm. Therefore, the width of the strip-shaped bending portion 32 can be appropriately set so that a region width in which the deformation occurs is within the thickness depending on the folded form. As an example, the strip-shaped bending portion 32 having a width of 2 to 30 mm can be formed.

The third embodiment is the same as the second embodiment on other points. Therefore, description about overlapping portions will be omitted. Further, the present form is also applicable to the first embodiment.

4. Fourth Embodiment

Figure 4:
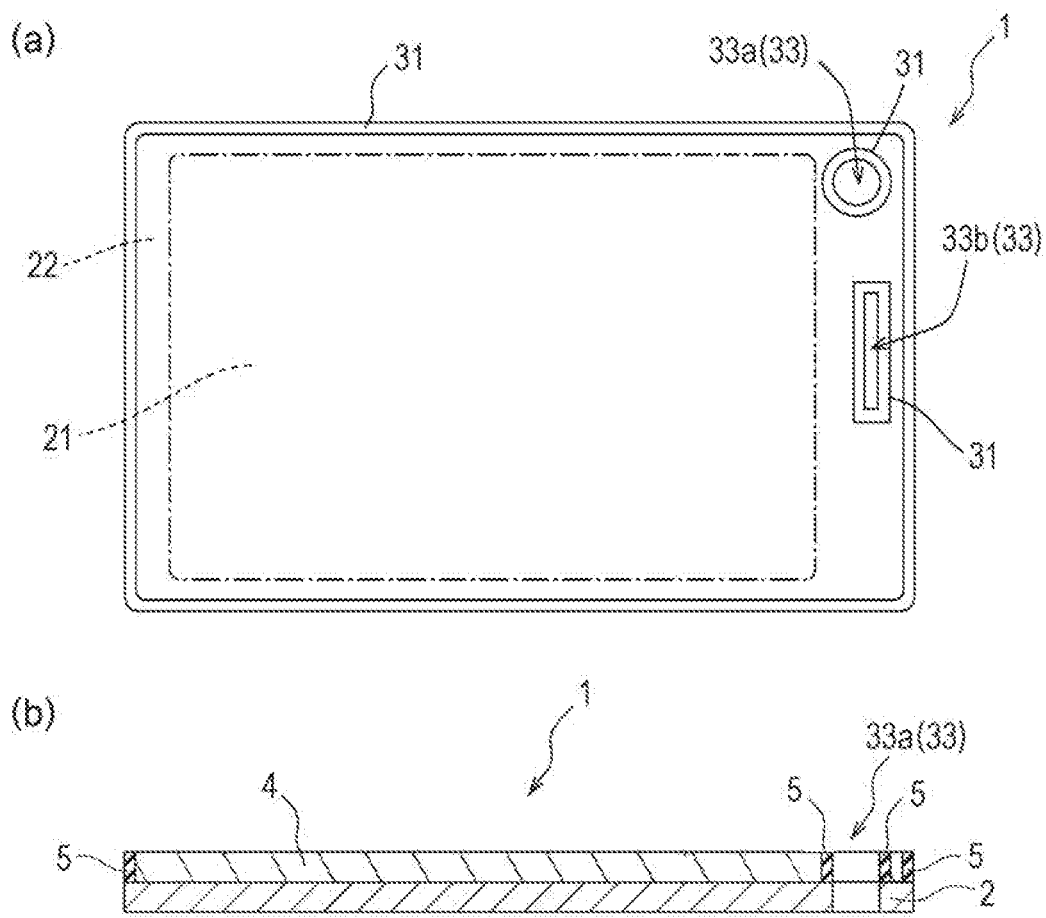
FIGS. 4A and 4B are schematic views of a hard coat-attached film type touch sensor according to a fourth embodiment of the present invention.

The hard coat-attached film type touch sensor 1 according to a fourth embodiment will be described with reference to FIGS. 4A and 4B. FIGS. 4A and 4B are schematic views of the hard coat-attached film type touch sensor according to the fourth embodiment of the present invention. FIG. 4A is a plan view of the hard coat-attached film type touch sensor 1. FIG. 4B is a cross-sectional view at the center of the short side of the hard coat-attached film type touch sensor 1.

As shown in FIGS. 4A and 4B, the hard coat-attached film type touch sensor 1 has a through-hole portion 33 at a center portion thereof. In this case, in addition to an outer peripheral portion thereof, a periphery of the through-hole portion 33 is also included in the edge portion 31. The fourth embodiment is different from the first embodiment in that the second hard coat layer 5 is provided here.

In this case, the second hard coat layer 5 having a low hardness and adjacent to the first hard coat layer 4 is also provided around the through-hole portion 33. This prevents cracks from occurring around the through-hole portion 33 in the edge portion 31 during drilling. Therefore, yield, quality, and production efficiency can be improved.

For example, a speaker 33b, a mechanical switch, a camera lens portion 33a, or the like is disposed in the through-hole portion 33 of the hard coat-attached film type touch sensor 1.

The fourth embodiment is the same as the first embodiment on other points. Therefore, description about overlapping portions will be omitted. Further, the present form is also applicable to the second and third embodiments.

5. Fifth Embodiment

Figure 5:
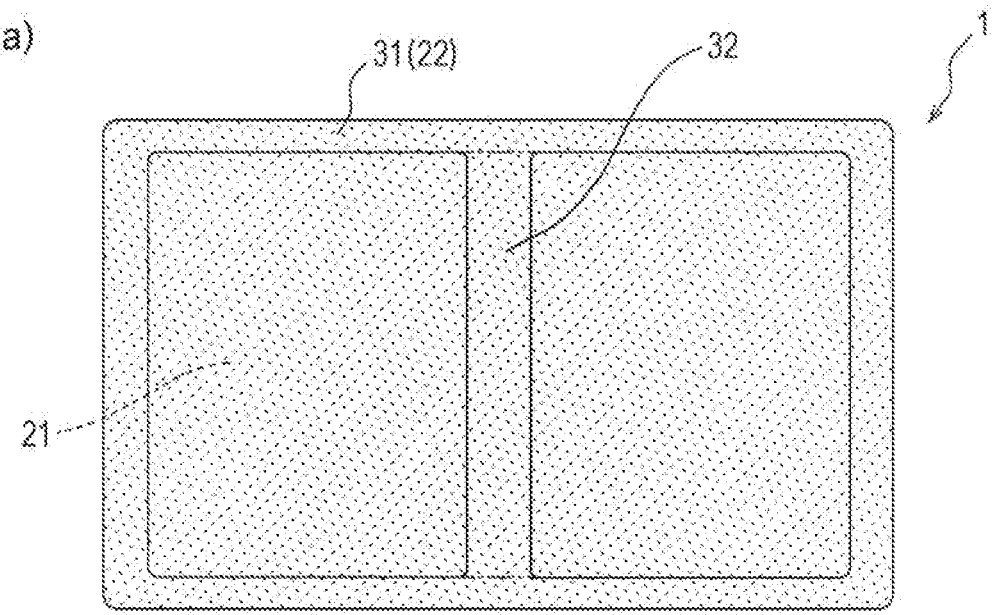
FIGS. 5A and 5B are schematic views of a hard coat-attached film type touch sensor according to a fifth embodiment of the present invention.
Figure 5:
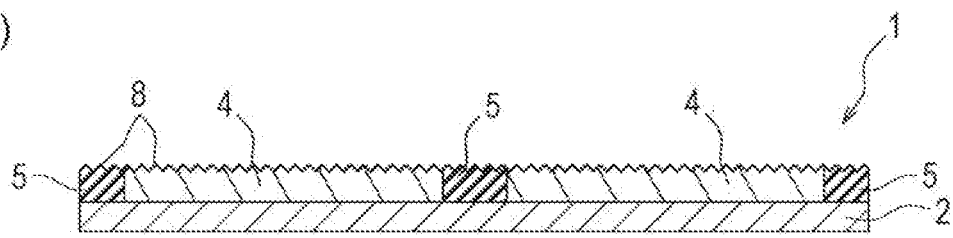

The hard coat-attached film type touch sensor 1 according to a fifth embodiment will be described with reference to FIGS. 5A and 5B. FIGS. 5A and 5B are schematic views of the hard coat-attached film type touch sensor according to the fifth embodiment of the present invention. FIG. 5A is a plan view of the hard coat-attached film type touch sensor 1. FIG. 5B is a cross-sectional view at the center of the short side of the hard coat-attached film type touch sensor 1.

As shown in FIGS. 5A and 5B, the fifth embodiment is different from the second embodiment in that the first hard coat layer 4 and the second hard coat layer 5 are flush with each other and are in a uniform matte state by a fine uneven surface 8.

In this case, the uniform matte state provided over the first hard coat layer 4 and the second hard coat layer 5 can reduce the visual discomfort at the boundary between the first hard coat layer 4 and the second hard coat layer 5.

The above matte state is such that the visibility of the organic EL display is not lowered so much. Specifically, haze Hz of the first hard coat layer 4 and the second hard coat layer 5 is preferably in a numerical range of 1.5 to 60%. If the haze Hz is less than 1.5%, an effect of reducing the visual discomfort cannot be sufficiently obtained. If the haze Hz exceeds 60%, the visibility of the organic EL display is hindered. The haze Hz is more preferably 3.0 to 30%.

Here, the haze Hz is a measured value measured according to JIS K7136:2000.

As a method for forming the fine uneven surface 8, a known method can be used.

Examples of the method include a method of imparting a desired roughness by treating surfaces of the first hard coat layer 4 and the second hard coat layer 5 directly, mechanically (sandblasting, embossing by embossing roller, or the like), optically (laser or the like), or physicochemically (etching by organic solvent inorganic chemicals, or the like), and a method of coating the first hard coat layer 4 and the second hard coat layer 5 made of a material containing fine particles, to expose a shape of the fine particles to the surfaces.

Further, the first hard coat layer 4 and the second hard coat layer 5 can also be made into the matte state without forming the fine uneven surface 8.

For example, the matte state may be realized by a diffusion effect by the fine particles inside the first hard coat layer 4 and the second hard coat layer 5 containing the fine particles and having a smooth surface.

The fifth embodiment is the same as the second embodiment on other points. Therefore, description about overlapping portions will be omitted. Further, the present form is also applicable to the first, third, and fourth embodiments.

6. Modifications

Hereinabove, one or more embodiments of the present invention have been described. However, the present invention is not limited to the above embodiments. Various modifications can be made without departing from the scope of the present invention. In particular, a plurality of embodiments and modifications described in this specification can be arbitrarily combined as necessary.

In each of the above embodiments, the first hard coat layer 4 and the second hard coat layer 5 have been described as the continuous integral film made of the same active ray curable resin, and differing only in degree of curing by light irradiation, however, it is not limited to this.

For example, the first hard coat layer 4 and the second hard coat layer 5 may be separate films made of materials having different hardnesses.

In case, separate coating steps are required for the first hard coat layer 4 and the second hard coat layer 5. Further, the first hard coat layer 4 and the second hard coat layer 5 are formed to have each pattern. Such first hard coat layer 4 and second hard coat layer 5 can be provided by the various general printing methods such as gravure printing, offset printing, or screen printing.

As the materials having different hardnesses, a combination of different resins can be appropriately selected, for example, from the above-mentioned active ray curable resins. Further, in the above-mentioned active ray curable resins, materials differing in hardness can be prepared by changing kinds or addition amounts of additives.

Further, a cured resin other than the active ray curable resin can also be used as a ma rial having a different hardness. For example, a thermosetting resin or a heated steam curable resin can be used.

As the second hard coat layer 5, a soft synthetic resin having self-repairing properties and scratch resistance can be used. Here, the self-repairing properties mean properties in which a scratch once generated disappears with time. Examples of the soft synthetic resin that can be used as the second hard coat layer 5 include polyurethane-based resins, acrylic transparent rubber resins, silicone-based rubber resins, olefin-based elastomers, styrene-based elastomers, mixtures thereof, mixtures thereof with other resins, polymer alloys and the like. The polyurethane-based resins are most preferable among them from the viewpoint of balance of transparency, self-repairing properties, and scratch resistance.

As shown in FIGS. 4A and 4B, as the fourth embodiment, an example is shown in which the hard coat-attached film type touch sensor 1 has the through-hole portion 33 near an end thereof, and the second hard coat layer 5 is provided not only in the outer peripheral portion but also around the through-hole portion 33. However, the present embodiment is not limited to this.

The through-hole portion 33 may be provided in any location of the hard coat-attached film type touch sensor 1. For example, the through-hole portion 33 may be provided in the center portion.

As shown in FIGS. 3A and 3B, as the third embodiment, an example is shown in which the hard coat-attached film type touch sensor 1 has one strip-shaped bending portion 32 for folding parallel to the short side at the center in the long side direction thereof, and the second hard coat layer 5 is provided in the strip-shaped bending portion 32. However, the present embodiment is not limited to this.

For example, the hard coat-attached film type touch sensor 1 has one strip-shaped bending portion 32 for folding parallel to the short side at the center in the long side direction thereof, and may also have one strip-shaped bending portion 32 for folding parallel to the long side at the center in the short side direction thereof. In this case, the touch sensor can be folded twice longitudinally and laterally. Further, two or more parallel strip-shaped bending portions 32 may be provided.

As the number of laminated layers of the film increases by the number of folding increasing, the width of the required strip-shaped bending portion 32 may be increased.

Further, in any of the above embodiments and modifications, an area of an independent region provided with the first hard coat layer 4 is 10 to 99.98% of a whole of the film type touch sensor.

That is, the first hard coat layer 4 gives priority to suppressing reduction in visibility of the flexible organic EL display due to the scratch on the outermost surface. Therefore, the first hard coat layer 4 is formed in a large area so as to ensure the visibility of display screens as much as possible. The area of the independent region means a region where one continuous first hard coat layer 4 is formed. Even if regions where discontinuous small areas made of the first hard coat layer 4 are formed are collected together, sufficient visibility of the display screens cannot be obtained.

On the other hand, the second hard coat layer 4 is formed with a small area so as not to hinder the visibility of the display screens as much as possible while improving the workability.

As a modification, the region provided with the second hard coat layer 4 may be further divided into a plurality of areas having different hardnesses. For example, two or more types of second hard coat layers 4 having different hardnesses may be used in the outer peripheral portion, around the through-hole portion 33, and in the strip-shaped bending portion 32.

7. Flexible Device

Figure 6:
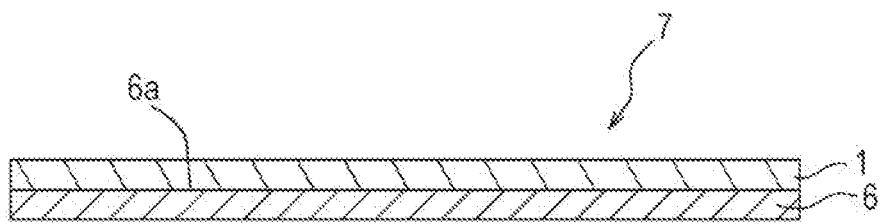
FIG. 6 is a schematic view of a flexible device according to the present invention.

A flexible device 7 using the hard coat-attached film type touch sensor 1 will be described with reference to FIG. 6. FIG. 6 is a schematic view of the flexible device 7 according to the present invention.

As shown in FIG. 6, the flexible device 7 includes a flexible organic EL display 6 and the hard coat-attached film type touch sensor 1 laminated on a display surface 6a of the flexible organic EL display 6.

The organic EL display is a display having an organic EL element utilizing electroluminescence of an organic compound. The organic EL element includes a pixel electrode, counter electrodes, and an organic light emitting layer for emitting electroluminescence disposed between both electrodes. A material of the organic light emitting layer for emitting electroluminescence can be broadly classified into a combination of low molecular weight organic compounds (host material and dopant material), and a high molecular weight organic compound. Examples of the high molecular weight organic compound for emitting electroluminescence include polyphenylene vinylene called PPV and derivatives thereof.

The flexible organic EL display 6 is a flexible organic EL display using a film substrate. Its usage form is free compared to a non-bending organic EL display (rigid type) using a glass substrate.

The hard coat-attached film type touch sensor 1 described above has various effects in addition to excellent workability in the manufacturing process while maintaining scratch resistance. Therefore, the flexible device 7 also has the same effect.

The flexible device 7 has been described so far using the flexible organic EL display 6 as the display of the flexible device 7. However, the present embodiment is not limited to this. A known flexible display other than e flexible organic EL display 6 may be used. Examples of other flexible displays include flexible liquid crystal, QLED (quantum-dot light emitting diode), micro LED, and EPD (Electrophoretic Display).

INDUSTRIAL APPLICABILITY

The hard coat-attached film type touch sensor of the present invention is used as a direct input interface for the display screens of smartphones, tablet terminals, rear liquid crystals of digital cameras, and game machines. In particular, the hard coat-attached film type touch sensor of the present invention disposed on a front surface of the flexible organic EL display can be applied to the display that is carried by being rolled or folded.

LIST OF REFERENCE NUMERALS

1: hard coat-attached film type touch sensor, 2: film type touch sensor, 21: transparent window portion, 22: window frame portion, 31: edge portion, 32: strip-shaped Lending portion, 33: through-hole portion, 4: first hard coat layer, 5: second hard coat layer, 6: flexible organic EL display, 6a: display surface, 7: flexible device, 8: fine uneven surface.

The invention claimed is:

1. A hard coat-attached film type touch sensor used laminated on a display surface of a flexible display, comprising:
   a film type touch sensor;
   a first hard coat layer provided in a large area on a region except for at least an edge portion of one main surface of the film type touch sensor; and
   a second hard coat layer provided adjacent to the first hard coat layer in a region where the first hard coat layer is not formed and having a lower hardness than the first hard coat layer.

2. The hard coat-attached film type touch sensor according to claim 1, wherein
   the film type touch sensor has a transparent window portion and a window frame portion surrounding the transparent window portion, and
   the region provided with the first hard coat layer is present on the transparent window portion and the window frame portion of the film type touch sensor except for the edge portion.

3. The hard coat-attached film type touch sensor according to claim 1, wherein
   the film type touch sensor has a transparent window portion and a window frame portion surrounding the transparent window portion, the region provided with the first hard coat layer is present on the transparent window portion of the film type touch sensor, and the region provided with the second hard coat layer is present on the window frame portion surrounding the transparent window portion of the film type touch sensor.

4. The hard coat-attached film type touch sensor according to claim 1, wherein the hard coat-attached film type touch sensor has a strip-shaped bending portion for folding at a specific position, and the strip-shaped bending portion is not provided with the first hard coat layer, but is provided with the second hard coat layer.

5. The hard coat-attached film type touch sensor according to claim 1, wherein the hard coat-attached film type touch sensor has a through-hole portion, and the edge portion includes a periphery of the through-hole portion.

6. The hard coat-attached film type touch sensor according to claim 1, wherein a hardness of the region provided with the first hard coat layer is in a range of pencil hardness H to 9H according to a pencil hardness test specified in JIS K 5600-5-4: 1999, and the hardness of the region provided with the second hard coat layer having a lower hardness than the first hard coat layer is in another range of pencil hardness 6B to 4H.

7. The hard coat-attached film type touch sensor according to claim 6, wherein a difference between the hardness of the region provided with the first hard coat layer and the hardness of the region provided with the second hard coat layer is at least two classes.

8. The hard coat-attached film type touch sensor according to claim 1, wherein the first hard coat layer and the second hard coat layer are a continuous integral film made of the same active ray curable resin, and differ only in degree of curing by light irradiation.

9. The hard coat-attached film type touch sensor according to claim 1, wherein the first hard coat layer and the second hard coat layer are separate films made of materials having different hardnesses.

10. The hard coat-attached film type touch sensor according to claim 1, wherein the first hard coat layer and the second hard coat layer are flush with each other and are in a uniform matte state.

11. The hard coat-attached film type touch sensor according to claim 1, wherein an area of an independent region provided with the first hard coat layer is 10 to 99.98% of a whole of the film type touch sensor.

12. The hard coat-attached film type touch sensor according to claim 1, wherein the edge portion is present within 1.5 mm from a side surface of the film type touch sensor.

13. The hard coat-attached film type touch sensor according to claim 1, wherein a region provided with the second hard coat layer is further divided into a plurality of regions having different hardnesses.

14. A flexible device comprising:

a flexible display; and the hard coat-attached film type touch sensor according to claim 1, that is laminated on the display surface of the flexible display.

15. The hard coat-attached film type touch sensor according to claim 2, wherein the hard coat-attached film type touch sensor has a strip-shaped bending portion for folding at a specific position, and the strip-shaped bending portion is not provided with the first hard coat layer, but is provided with the second hard coat layer.

16. The hard coat-attached film type touch sensor according to claim 2, wherein the hard coat-attached film type touch sensor has a through-hole portion, and the edge portion includes a periphery of the through-hole portion.

17. The hard coat-attached film type touch sensor according to claim 2, wherein a hardness of the region provided with the first hard coat layer is in a range of pencil hardness H to 9H according to a pencil hardness test specified in JIS K 5600-5-4: 1999, and the hardness of the region provided with the second hard coat layer having a lower hardness than the first hard coat layer is in another range of pencil hardness 6B to 4H.

18. The hard coat-attached film type touch sensor according to claim 2, wherein the first hard coat layer and the second hard coat layer are a continuous integral film made of the same active ray curable resin, and differ only in degree of curing by light irradiation.

19. The hard coat-attached film type touch sensor according to claim 2, wherein the first hard coat layer and the second hard coat layer are separate films made of materials having different hardnesses.

20. The hard coat-attached film type touch sensor according to claim 2, wherein the first hard coat layer and the second hard coat layer are flush with each other and are in a uniform matte state.

* * * * *